US010256305B2

(12) United States Patent
Choi et al.

(10) Patent No.: US 10,256,305 B2
(45) Date of Patent: Apr. 9, 2019

(54) HIGH MOBILITY TRANSPORT LAYER STRUCTURES FOR RHOMBOHEDRAL SI/GE/SIGE DEVICES

(71) Applicant: The United States of America as represented by the Administrator of the National Aeronautics and Space Administration, Washington, DC (US)

(72) Inventors: Sang Hyouk Choi, Poquoson, VA (US); Yeonjoon Park, Yorktown, VA (US); Glen C. King, Williamsburg, VA (US); Hyun-Jung Kim, Poquoson, VA (US); Kunik Lee, Troy, MI (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 15/449,449

(22) Filed: Mar. 3, 2017

(65) Prior Publication Data
US 2017/0179233 A1    Jun. 22, 2017

Related U.S. Application Data

(62) Division of application No. 14/202,699, filed on Mar. 10, 2014, now Pat. No. 9,614,026.
(Continued)

(51) Int. Cl.
*H01L 29/15*    (2006.01)
*H01L 29/04*    (2006.01)
(Continued)

(52) U.S. Cl.
CPC ........ *H01L 29/157* (2013.01); *H01L 21/0242* (2013.01); *H01L 21/0245* (2013.01);
(Continued)

(58) Field of Classification Search
CPC ... H01L 29/157; H01L 29/165; H01L 29/045; H01L 31/035236
See application file for complete search history.

(56) References Cited

U.S. PATENT DOCUMENTS 4,357,183 A    11/1982    Fan et al.
5,205,871 A    4/1993    Godbey et al.
(Continued)

OTHER PUBLICATIONS

Nakamura, T. Mukai T et al., "High-Power GaN P—N Junction Blue-Light-Emitting Diodes," Japanese Journal of Applied Physics, Dec. 1991, pp. L1998-L2001, vol. 30, No. 12A.
(Continued)

*Primary Examiner* — Yu Chen
*Assistant Examiner* — Vincent Wall
(74) *Attorney, Agent, or Firm* — Jennifer L. Riley; Robin W. Edwards; Mark P. Dvorscak (57) ABSTRACT

An electronic device includes a trigonal crystal substrate defining a (0001) C-plane. The substrate may comprise Sapphire or other suitable material. A plurality of rhombohedrally aligned SiGe (111)-oriented crystals are disposed on the (0001) C-plane of the crystal substrate. A first region of material is disposed on the rhombohedrally aligned SiGe layer. The first region comprises an intrinsic or doped Si, Ge, or SiGe layer. The first region can be layered between two secondary regions comprising n+doped SiGe or n+doped Ge, whereby the first region collects electrons from the two secondary regions.

15 Claims, 7 Drawing Sheets

Related U.S. Application Data (60) Provisional application No. 61/779,317, filed on Mar. 13, 2013.

(51) Int. Cl.
| | |
|---|---|
| *H01L 29/165* | (2006.01) |
| *H01L 31/0352* | (2006.01) |
| *H01L 31/0368* | (2006.01) |
| *H01L 35/22* | (2006.01) |
| *H01L 21/02* | (2006.01) |
| *H01L 31/0336* | (2006.01) |
| *H01L 29/778* | (2006.01) |

(52) U.S. Cl.
CPC .. *H01L 21/02433* (2013.01); *H01L 21/02516* (2013.01); *H01L 21/02532* (2013.01); *H01L 21/02584* (2013.01); *H01L 29/045* (2013.01); *H01L 29/155* (2013.01); *H01L 29/165* (2013.01); *H01L 31/0336* (2013.01); *H01L 31/03682* (2013.01); *H01L 31/035236* (2013.01); *H01L 35/22* (2013.01); *H01L 29/7782* (2013.01); *Y02E 10/546* (2013.01)

(56) References Cited

U.S. PATENT DOCUMENTS

| | | | |
|---|---|---|---|
| 5,252,131 A * | 10/1993 | Kiyama | C23C 16/44 118/719 |
| 5,347,157 A | 9/1994 | Hung et al. | |
| 5,394,826 A | 3/1995 | Ebe et al. | |
| 5,667,586 A | 9/1997 | Elk et al. | |
| 5,709,745 A | 1/1998 | Larkin et al. | |
| 5,759,898 A | 6/1998 | Ek et al. | |
| 5,769,964 A | 6/1998 | Charache et al. | |
| 5,951,757 A * | 9/1999 | Dubbelday | C30B 25/02 117/102 |
| 6,096,389 A | 8/2000 | Kanai | |
| 6,100,546 A | 8/2000 | Major et al. | |
| 6,306,211 B1 | 10/2001 | Takahashi et al. | |
| 6,488,771 B1 | 12/2002 | Powell et al. | |
| 6,524,935 B1 | 2/2003 | Canaperi et al. | |
| 6,562,127 B1 | 5/2003 | Kud et al. | |
| 6,627,809 B1 | 9/2003 | Koga et al. | |
| 6,653,658 B2 | 11/2003 | Burden | |
| 6,784,074 B2 | 8/2004 | Shchukin et al. | |
| 6,787,793 B2 | 9/2004 | Yoshida | |
| 7,247,885 B2 | 7/2007 | Rankin et al. | |
| 7,341,883 B2 | 3/2008 | Park et al. | |
| 7,368,335 B2 | 5/2008 | Asami et al. | |
| 7,558,371 B2 | 7/2009 | Park et al. | |
| 7,769,135 B2 | 8/2010 | Park et al. | |
| 7,906,358 B2 | 3/2011 | Park et al. | |
| 8,044,294 B2 | 10/2011 | Park et al. | |
| 8,226,767 B2 | 7/2012 | Park et al. | |
| 8,257,491 B2 | 9/2012 | Park et al. | |
| 2002/0172820 A1 * | 11/2002 | Majumdar | B82Y 10/00 428/357 |
| 2003/0209191 A1 | 11/2003 | Purdy | |
| 2006/0270200 A1 | 11/2006 | Shibata | |
| 2007/0168130 A1 | 7/2007 | Sherwood et al. | |
| 2007/0222034 A1 * | 9/2007 | Park | C30B 25/02 257/616 |
| 2008/0113186 A1 | 5/2008 | Kouvetakis et al. | |
| 2008/0257395 A1 | 10/2008 | Jovanovic et al. | |
| 2009/0165837 A1 | 7/2009 | Park et al. | |
| 2009/0206368 A1 | 8/2009 | Park et al. | |
| 2009/0220047 A1 | 9/2009 | Park et al. | |

OTHER PUBLICATIONS

O. Ambacher, "Growth and Applications of Group III-nitrides," Journal of Physics D—Applied Physics, 1998, pp. 2653-2710, vol. 31.

Yeonjoon Park et al., "Analysis of Twin Defects in GaAs(111)B Moelcular Beam Epitaxy Growth," Journal of Vacuum Science and Technology B, May-Jun. 2000, pp. 1566-1571, vol. 18, No. 3.

B. Sanorpim S et al., "Characterization of MOVPE-grown GaN layers on GaAs (111)B with a cubic-GaN(111) epitaxial intermediate layer," Physical Status Solidi, Nov. 2003, pp. 305-309, vol. 240, No. 2.

Z. Liliental-Weber et al., "Electron Microscopy Characterization of GaN Films Grown by Molecular-beam Epitaxy on Sapphire and SiC," Journal of Vacuum Science and Technology B, Jul.-Aug. 1995. pp. 1578-1581, vol. 13, No. 4.

Y. Park, G.C. King, S. H. Choi, "Rhombohedral Epitaxy of Cubic SiGe on Trigonal c-plane sapphire," Journal of Crystal Growth, 2008, pp. 2724-2731, No. 310.

T.P. Humphreys et al. "Hetercepitaxial growth and characterization of GaAs on silicon-on sapphire and sapphire substrates," Appl. Phys. Lett., Apr. 1989, pp. 1687-1689, vol. 54, No. 17.

Chris G. Van de Walle et al., "Theoretical calculations of heterojunction discontinuities in the Si/Ge system," Physical Review B, Oct. 1986, pp. 5621-5634, vol. 34, No. 8.

Martin M. Rieger, et al., "Electronic-band parameters in strained Si1-xGex alloys on Si1-yGey substrates," Phys. Rev. B , 1993, pp. 14276-14287, vol. 48, No. 19.

Max V. Fischetti, et al., "Band structure, deformation potentials and carrier mobility in strained Si, Ge, and SiGe alloys," Journal of Applied Physics, Aug. 1996, pp. 2234-2252, vol. 80, No. 4.

C. Jacoboni, et al., "A Review of Some Charge Transport Properties of Silicon," Solid-State Electronics, 1997, vol. 20, pp. 77-89, Pergamon Press.

H. Wado, et al., "Epitaxial growth of SiGe on Al2O3 using Si2H6 gas and Ge solid source molecular beam epitaxy," Journal of Crystal Growth, vol. 169, pp. 457-462. (1996).

Suraj J. Mathew et al., "Effect of GE Profile on the Frequency Response of a SiGepFET on Sapphire Technology," Device Research Conference Digest, Jun. 23-25, 1997, pp. 130-131, Fort Collins, Colorado.

P.M. Mooney, et al., "X-ray diffraction analysis of SiGe/Si heterostructures on sapphire substrates," Applied Physics Letters, Jun. 1998, pp. 924-926, vol. 73, No. 7.

Suraj J. Mathew, et al., "Hole Confinement and Low-Frequency Noise in SiGe pFET's on Silicon-on-Sapphire," IEEE Electron Device Letters, Apr. 1999, pp. 173-175, vol. 20, No. 4.

I. Lagnado, et al.,"Integration of Si and SiGe with Al2O3 (sapphire)," Microelectronic Engineering , 2001, pp. 455-459, vol. 59.

Hiroyuki Wado, et al.,"Epitaxal growth of SiGa on Al2O3 using Si2H6 gas and Ge solid source molecular beam epitaxy," Journal of Crystal Growth, 1996, pp. 457-462, vol. 169.

Yan Zhang, et al., "Measurement of Seebeck coefficient perpendicular to SiGe superlattice", Twenty-First International Conference on Thermoelectrics, Aug. 25-29, 2002, pp. 329-332, Long Beach, California.

W. B Dubbelday, et al., "The growth of SiGe on sapphire using rapid thermal chemical vapor deposition," Journal of Crystal Growth. 2001, pp. 20-28, vol. 222.

* cited by examiner

○ Electrons, negative charge carrier
⊕ Ionized n-dopants, positively charged coulomb scattering center

○ Holes, positive charge carrier
⊙ Electrons, negative charge carrier
⊕ Ionized n-dopants, positively charged coulomb scattering center
⊗ Ionized p-dopants, negatively charged coulomb scattering center

Fig. 7

HIGH MOBILITY TRANSPORT LAYER STRUCTURES FOR RHOMBOHEDRAL SI/GE/SIGE DEVICES

CROSS-REFERENCE TO RELATED APPLICATION

This patent application is a divisional of U.S. Non-Provisional patent application Ser. No. 14/202,699 filed on Mar. 10, 2014, which claims the benefit of priority to U.S. Provisional Application Ser. No. 61/779,317, filed Mar. 13, 2013, for "High Mobility Transport Layer Structures for Rhombohedral Si/Ge/SiGe Devices". The contents of the foregoing applications are hereby incorporated by reference in their entireties.

STATEMENT REGARDING FEDERALLY SPONSORED RESEARCH OR DEVELOPMENT

The invention described herein was made in part by employees of the United States Government and may be manufactured and used by or for the Government of the United States of America for governmental purposes without the payment of any royalties thereon or therefore.

FIELD OF THE INVENTION

The present invention relates to integrated circuits ("IC") semiconductor electronic devices, and in particular to an electronic device including a high mobility transport layer such as crystalline SiGe on a sapphire chip.

BACKGROUND OF THE INVENTION

Performance of many electronic devices, such as transistors, solar cells, thermo-electric (TE) devices can be improved if carrier mobility is increased. Prior calculations show that Si and Ge have Type-II band gap alignment in cubically strained and relaxed layers. Quantum wells and super lattices with Si, Ge, and SiGe have been good noble structures to build high electron mobility layers and high hole mobility layers. However, the atomic lattice constant of Ge is bigger than that of Si, and direct epitaxial growth generates a high density of misfit dislocations which decreases carrier mobility and shortens the life time of devices. Known configurations utilize special buffer layers such as super lattice or gradient indexed layers to grow Ge on Si wafers or Si on Ge wafers. The growth of these buffer layers takes extra time and effort. For example, the layers can be subject to a post-annealing process to remove dislocations by dislocation gliding inside of the buffer layer or layers.

BRIEF SUMMARY OF THE INVENTION

Prior Silicone-on-Sapphire (SOS) technology typically utilizes R-plane (1-102) Sapphire which has a rectangular plane. Silicone (100) crystal is grown on the R-plane Sapphire. In contrast, the present invention utilizes C-plane (0001) Sapphire which has a triangle plane, and a Si (Ge) (C) (111) crystal or an alloy of group IV semiconductor (111) crystal is grown thereon.

One embodiment is an electronic device including a trigonal crystal (e.g. Sapphire) substrate defining a (0001) C-plane, and plurality of rhombohedrally aligned (111)-oriented crystals disposed on the (0001) C-plane of the Sapphire substrate. The (111)-oriented crystals can comprise a group IV semiconductor or an alloy of group IV semiconductors (e.g. SiGe). The device further includes a first region disposed on the rhombohedrally aligned SiGe layer, the first region comprising a layer of intrinsic or doped Si, Ge, SiGe. The first region can comprise p-doped Ge or intrinsic Ge, wherein the first region has a thickness of less than about 100 nanometers ("nm"). The first region can be layered between two adjacent secondary regions, the secondary regions can comprise p+ doped SiGe or p+ doped Si, such that the first region collects holes from the two secondary regions. The first region can have at least two times higher hole mobility than the adjacent secondary regions.

The first region can comprise n–doped Si or intrinsic Si, wherein the first region has a thickness that is less than about 100 nm. The first region can be layered between two adjacent secondary regions, wherein the secondary regions comprise n+ doped SiGe or Ge, such that the first region collects electrons from the two adjacent secondary regions. The first region can have at least two times higher electron mobility than the adjacent secondary regions.

The first region can comprise p–doped Ge or intrinsic Ge, wherein the first region has a thickness that is less than about 100 nm. The first region may be layered between two adjacent secondary regions, the adjacent secondary regions comprising p+ doped SiGe or Si, such that the first region collects holes from the two secondary regions. The device can include a third region comprising n–doped Si or intrinsic Si with the third region having a thickness of less than about 100 nm. The third region can be layered between two adjacent fourth regions comprising n+ doped SiGe or Ge such that the third region collects electrons from the two fourth regions. The first region can have at least two times higher hole mobility than the adjacent secondary regions, and the third region can have at least two times higher electron mobility than the adjacent fourth regions.

Another embodiment is a method of fabricating an electronic device. The method includes providing a trigonal crystal substrate defining a (0001) C-plane. Heat is applied to the substrate to raise the temperature of the substrate to a level that facilitates growth of rhombohedrally aligned Si or SiGe material. A layer of a buffer material selected from the group consisting of group IV semiconductors and alloys formed of group IV semiconductors is grown on the substrate. The layer of buffer material comprises a plurality of rhombohedrally aligned (111)-oriented crystals disposed on the (0001) C-plane of the crystal substrate. A first region of material is grown on the buffer layer. The first region comprises an intrinsic or doped first semiconductor material selected from the group consisting of Si, Ge, SiGe. The first region can comprise a first layer of SiGe, and the method can further include growing a layer of Ge material on the first layer, and growing a second layer of SiGe material on the layer of Ge material, such that the layer of Ge material is disposed between adjacent layers of SiGe material. The first and second layers of SiGe can comprise p+ doped SiGe, and the layer of Ge material can comprise p–doped Ge.

These and other features, advantages, and objects of the present invention will be further understood and appreciated by those skilled in the art by reference to the following specification, claims, and appended drawings.

DETAILED DESCRIPTION

Figure 2:
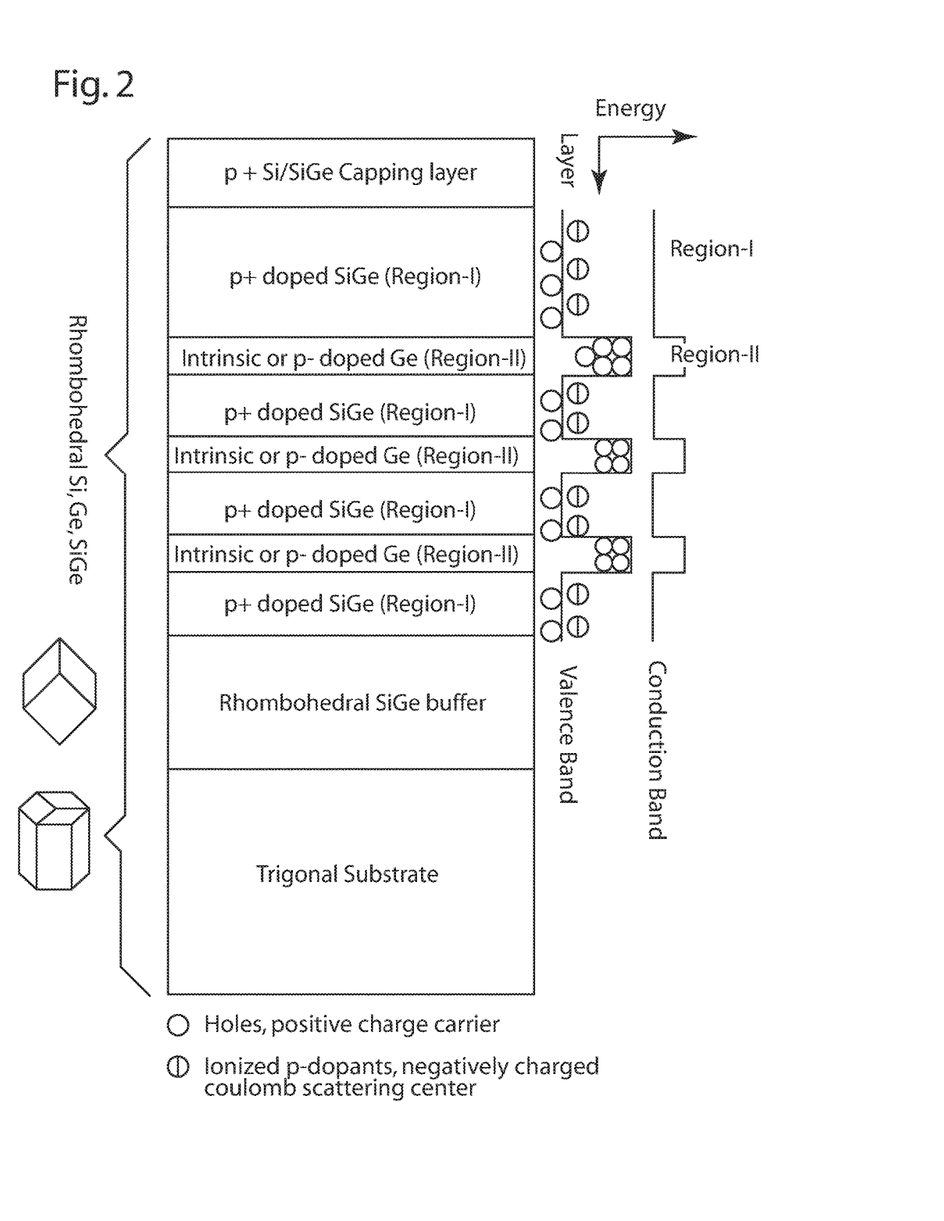
FIG. 2 is a schematic diagram that shows rhombohedral SiGe/Ge high hole mobility layers for p-type TE material, transistor, and solar cell layer.

For purposes of description herein, the terms "upper," "lower," "right," "left," "rear," "front," "vertical," "horizontal," and derivatives thereof shall be related to the invention as oriented in FIG. 2. However, it is to be understood that the invention may assume various alternative orientations, except where expressly specified to the contrary. It is also to be understood that the specific devices and processes illustrated in the attached drawings, and as described in the following specification are simply exemplary embodiments of the inventive concepts defined in the appended claims. Furthermore, references to specific items or features shall not be construed as limiting the item or feature to one-piece or multi-piece items or features. Hence, specific dimensions and other physical characteristics relating to the embodiments disclosed herein are not to be considered as limiting, unless the claims expressly state otherwise.

As discussed above, carrier mobility affects performance of many electronic devices such as transistors, solar cells, thermo-electric (TE) devices and the like. The performance of such devices can be improved if carrier mobility is increased. Prior calculations show that Si and Ge have type-II bandgap alignment in cubically strained and relaxed layers.

The present disclosure is related to U.S. Pat. No. 7,558,371, METHOD OF GENERATING X-RAY DIFFRACTION DATA FOR INTEGRAL DETECTION OF TWIN DEFECTS IN SUPER-HETERO-EPITAXIAL MATERIALS, issued Jul. 7, 2009, U.S. Pat. No. 8,226,767, HYBRID BANDGAP ENGINEERING FOR SUPER-HETERO-EPITAXIAL SEMICONDUCTOR MATERALS, AND PRODUCTS THEREOF, issued Jul. 24, 2012, U.S. Pat. No. 7,769,135, X-RAY DIFFRACTION WAFER MAPPING METHOD FOR PHOMBOHEDRAL SUPER-HETERO-EPITAXY, issued Aug. 3, 2010, and U.S. Pat. No. 8,257,491, RHOMBOHEDRAL CUBIC SEMICONDUCTOR MATERIALS ON TRIGONAL SUBSTRATE WITH SINGLE CRYSTAL PROPERTIES AND DEVICES BASED ON SUCH MATERIALS, issued Sep. 4, 2012, the entire contents of each being incorporated by reference herein. These patents disclose processes/techniques that can be utilized to grow rhombohedrally aligned single crystalline SiGe layers on the C-plane of trigonal substrates such as Sapphire. Previously, epitaxial growth was taken with cubic SiGe on another cubic substrate with the square (100) surface interface. The rhombohedral epitaxy technology described in the above-identified patents provides for alignment of (111)-oriented cubic Si/Ge/SiGe crystals on (0001) C-plane of trigonal substrates with hexagonal-triangular three-fold interface. This epitaxial technology enables utilization of thousands of trigonal crystals as a substrate for SiGe alloy structures.

The present disclosure relates to fabrication of more complex high mobility layer structures for rhombohedrally aligned SiGe on a trigonal substrate. It will be understood that other group IV semiconductors and alloys may be rhombohedrally aligned on a trigonal substrate. Thus, according to other embodiments, Si, Ge, C, SiC, GeC, and SiGeC can also be utilized to form a rhombohedrally aligned buffer layer or a trigonal substrate. The trigonal substrate can comprise Sapphire, Lithium Niobate ($LiNbO_3$), Langasite, Langatate, Antimony, Calcite, or other suitable material.

Figure 1:
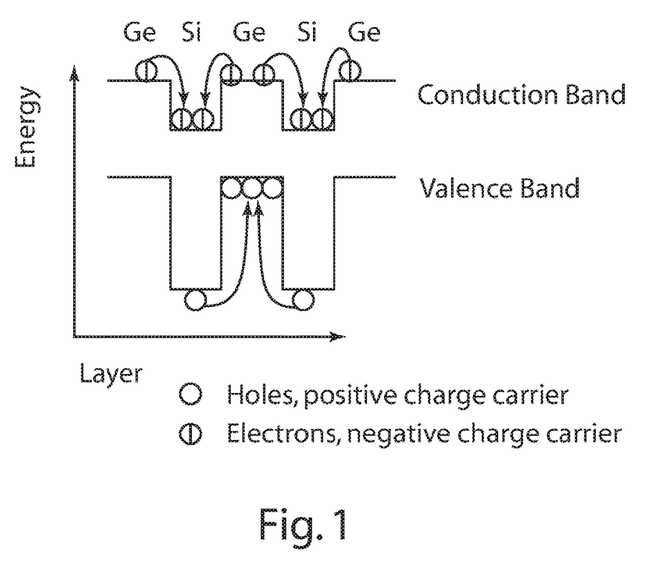
FIG. 1 is a schematic diagram that shows a Type-II bandgap alignment of Si and Ge.

FIG. 1 shows the type-II bandgap alignment of Si and Ge such that Si has a lower conduction band energy and a lower valence band energy than Ge. The bandgap of Si is 1.1 eV and that of Ge is 0.67 eV at room temperature. Detailed numerical values of band alignments of cubically strained and relaxed Si/Ge/SiGe are known in the art. In rhombohedrally aligned SiGe an additional correction term is required because the strain direction of the rhombohedrally aligned SiGe is not the same as that of cubically strained and relaxed Si/Ge/SiGe. Therefore, a new calculation of band alignment is needed for strain effects on [111] direction which are perpendicular to <2-20> in-plane directions.

In FIG. 1, a Si layer is disposed between two Ge layers. The Si layer has a slower conduction band that forms a quantum well for electrons. In other words, electrons in the conduction band drift into the Si layer to "find" a lower energy state. Also, a Ge layer between two Si layers has a higher valence band top energy level such that it forms a quantum well for holes (i.e. it attracts holes in the valence band). This principle concept is utilized in the high mobility transport layer structures in FIGS. 2 and 3 according to one embodiment.

In FIG. 2, SiGe and Ge layers are grown with rhombohedral alignment on a trigonal substrate. An optional rhombohedral SiGe buffer layer can be formed on a trigonal substrate. The trigonal substrate can comprise Sapphire or other suitable material. In FIG. 2, the circles with vertical lines represent ionized p–dopants, or negatively charged Coulomb scattering, centers, The open dots/circles represent holes or positive charge carriers. Region-I is a highly doped p-type SiGe (p+doped SiGe) and Region-II is intrinsic or low-density doped p-type pure Ge layer (no Si). Region-II has a higher valence band top energy level so that it forms a quantum well for holes. Region-I has a high density of p-type dopants and numerous holes generated from p-type dopants. Once p-type dopants in Region-I are ionized to release holes into the valence band, ionized dopants form a negatively charged Coulomb scattering center. Thus, the hole-mobility of Region-I is very low. The high-density holes which are generated by Region-I drift into the hole quantum well of Region-II. Region-II receives a high density of holes from Region-I, yet it has few scattering centers because Region-II is intrinsic or very low doped p-type layer. Therefore, Region-II has a very high hole mobility with a high density of holes which came from Region-I, Thus, Region-II functions as an ultra-fast super-highway of holes (ie. a high mobility transport region).

Figure 4:
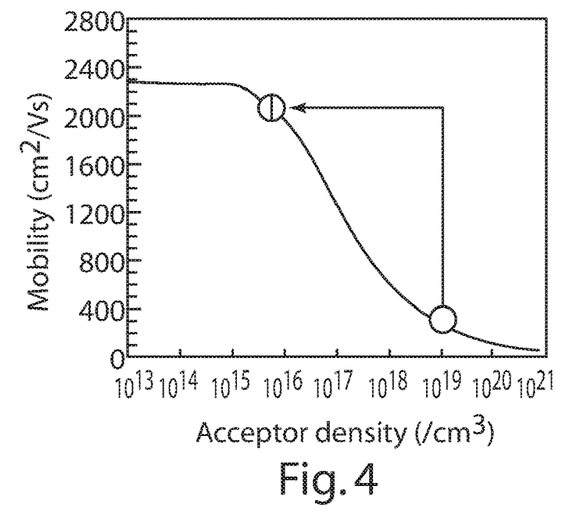
FIG. 4 is a graph that shows an approximation of hole mobility vs. hole density of p-type Ge.

For example, Region-I (Si or SiGe) can be doped with p-type dopants such as Boron of $10^{19}/cm^3$ concentration, and Region-II (pure Ge) can be low density p-type doped at $10^{16}/cm^3$ concentration. FIG. 4 shows the enhancement of mobility from 200 cm2/V·s at $10^{19}/cm^3$ doping density to 2000 cm2/V·s at $10^{16}$/cm$^3$ doping density. Therefore 10 times faster mobility is achieved with high mobility hole transport layer in FIG. 2.

Figure 3:
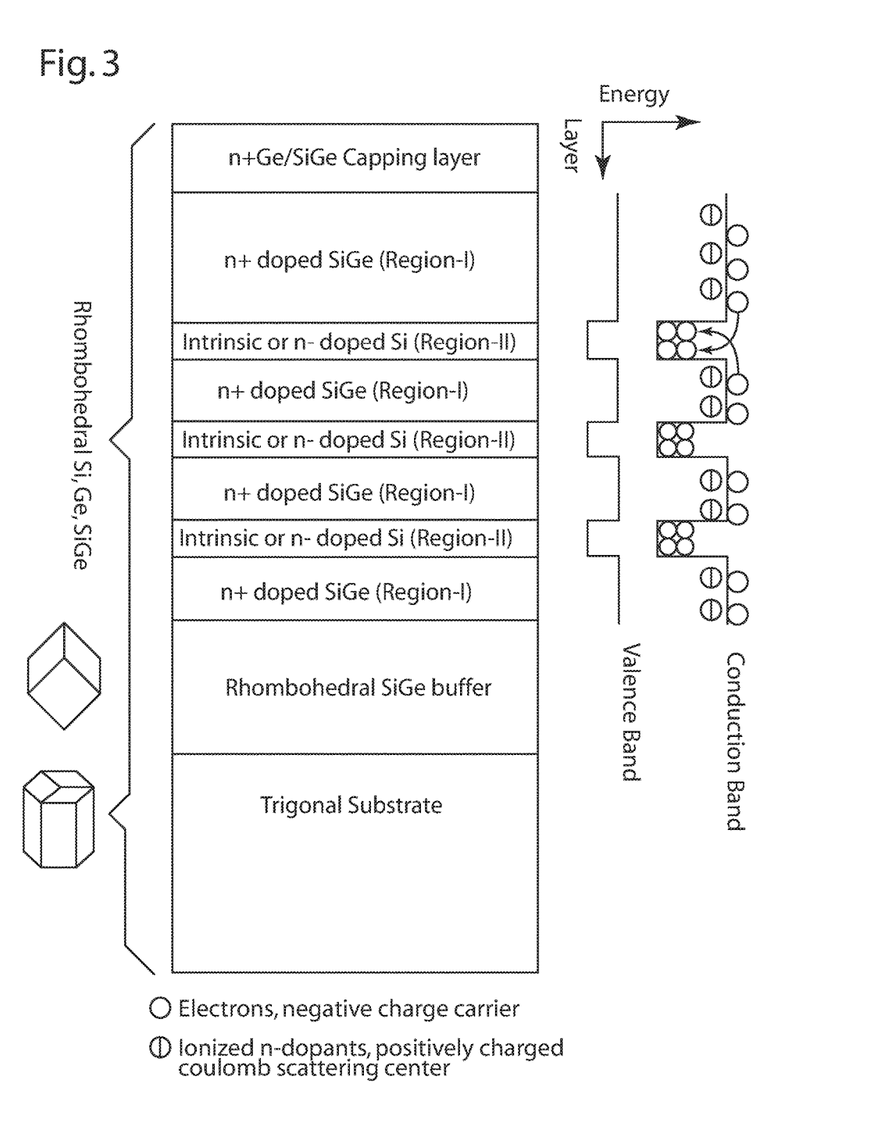
FIG. 3 is a schematic diagram that shows a rhombohedral SiGe/Si high electron mobility layers for n-type TE material, transistor, and solar cell layer.

FIG. 3 shows a similar high mobility transport layer for electrons comprising a heavily doped n+ SiGe layer (Region-I) and an intrinsic or low n-type doped pure Si (no Ge) layer (Region-II). In FiG.3, the circles with vertical lines represent ionized p–dopants, or negatively charged Coulomb scattering centers. The open dots/circles represent holes or positive charge carriers. Intrinsic or low n–doped Si layer (Region-II) has a lower conduction band than that of SiGe or Ge in Region-I, so that Region-II forms a quantum well for electrons. Similarly, the mobile electrons from heavily doped Region-I (n+ SiGe) drift into electron quantum well of Region-II which has a very high mobility with very few scattering centers. Therefore, Region-II (intrinsic or low n–doped Si) layer becomes a super highway of mobile electrons, i.e. a high. mobility electron-transport layer.

Figure 5:
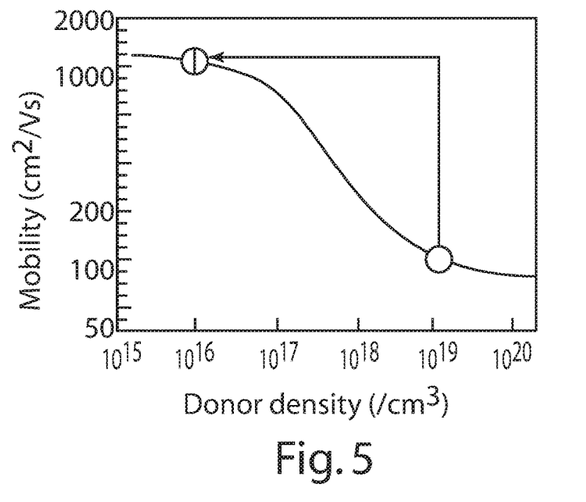
FIG. 5 is a graph that shows an approximation of electron mobility vs. donor density of n-type Si.

According to another example, Region-I (Ge or SiGe) can be doped with n-type dopants such as Phosphorous of $10^{19}$/cm$^3$ concentration, and Region-II (pure Si) may be low density n-type doped at $10^{16}$/cm$^3$ concentration. FIG. 5 shows the enhancement of electron mobility from 120 cm$^2$/V·s at $10^{19}$/cm$^3$ doping density to 1200 cm$^2$/V·s at $10^{16}$/cm$^3$ doping density. Therefore 10 times faster mobility is achieved with the high mobility electron transport layer in FIG. 3.

In the examples of high mobility transport layers above, the ultra fast Region II is pure Ge (no Si) and pure Si (no Ge) in FIGS. 2 and 3, respectively. Thus, the fast transport layers do not have an alloy scattering effect and also maintain high mobility of intrinsic or very low doped semiconductors. Repetition of Region-I and Region-II in a device or structure generates a plurality of high mobility transport layers making high current flow possible.

An optional Rhombohedral SiGe buffer layer can be utilized to improve the single crystalline quality of Region-I and Region-II. An optional capping layer can be utilized to reduce surface charge loss effect.

The high mobility transport layer structures in FIGS. 2 and 3 can be used for many electronic device applications. For example, if the left side is hot (above 500° C.) and right side is cold (300° C.) this structure can be used as a p-type TE material structure (FIG. 2 structure) and a n-type TE material structure (FIG. 3 structure). Compared to conventional TE devices, this arrangement provides higher current output and better figure of merit (thermoelectric ZT factor) due to the increased charge-carrier mobilities. Similar structures with one or more multiples of Region-I and Region-II layers under gate voltage can be used for transistors. Also, the structures of FIG. 2 or 3 can be utilized in solar cells. Such solar cells have higher efficiency due to the enhanced charge transport mechanism of the high mobility transport layers.

Figure 6:
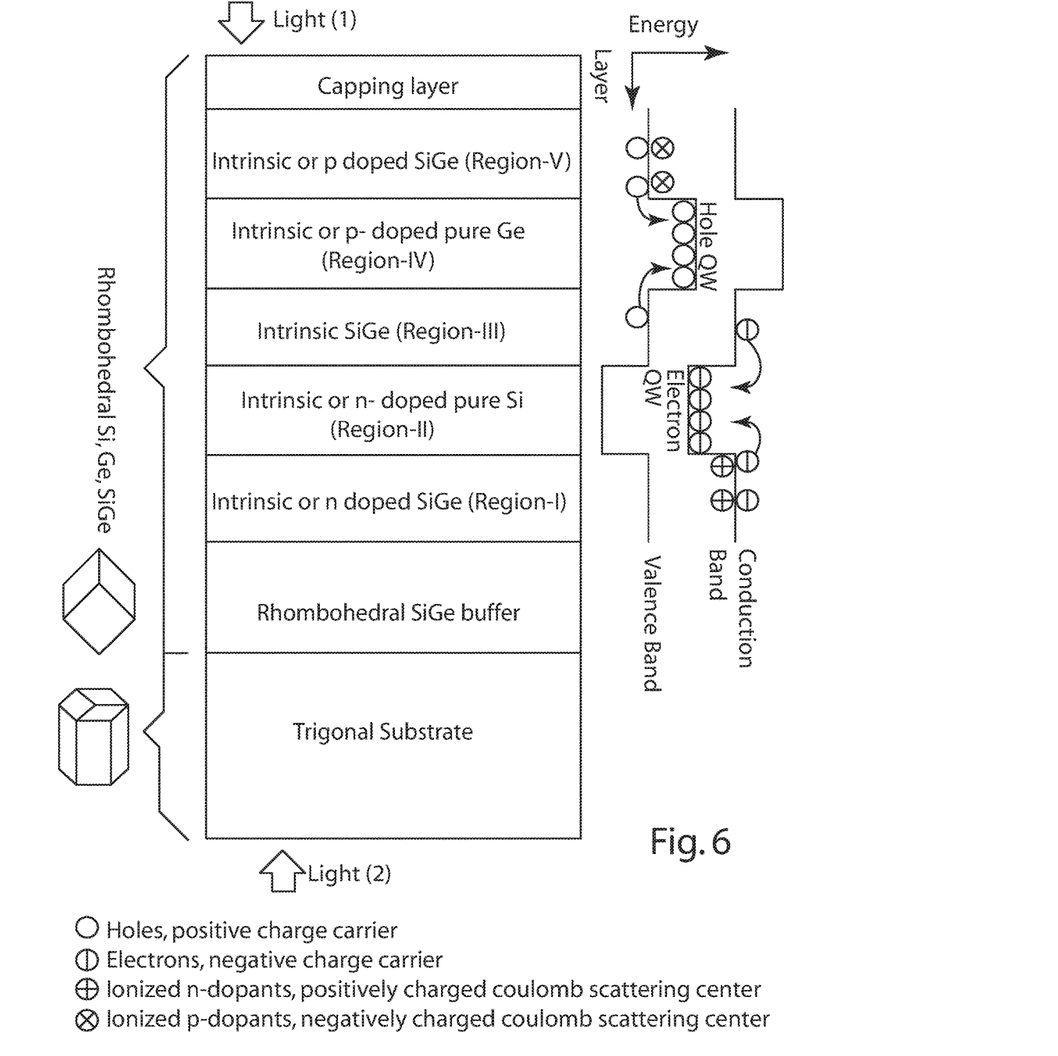
FIG. 6 is a schematic diagram that shows an enhanced solar cell structure-I with two high mobility transport layers made of electron quantum well and hole quantum well.
Figure 7:
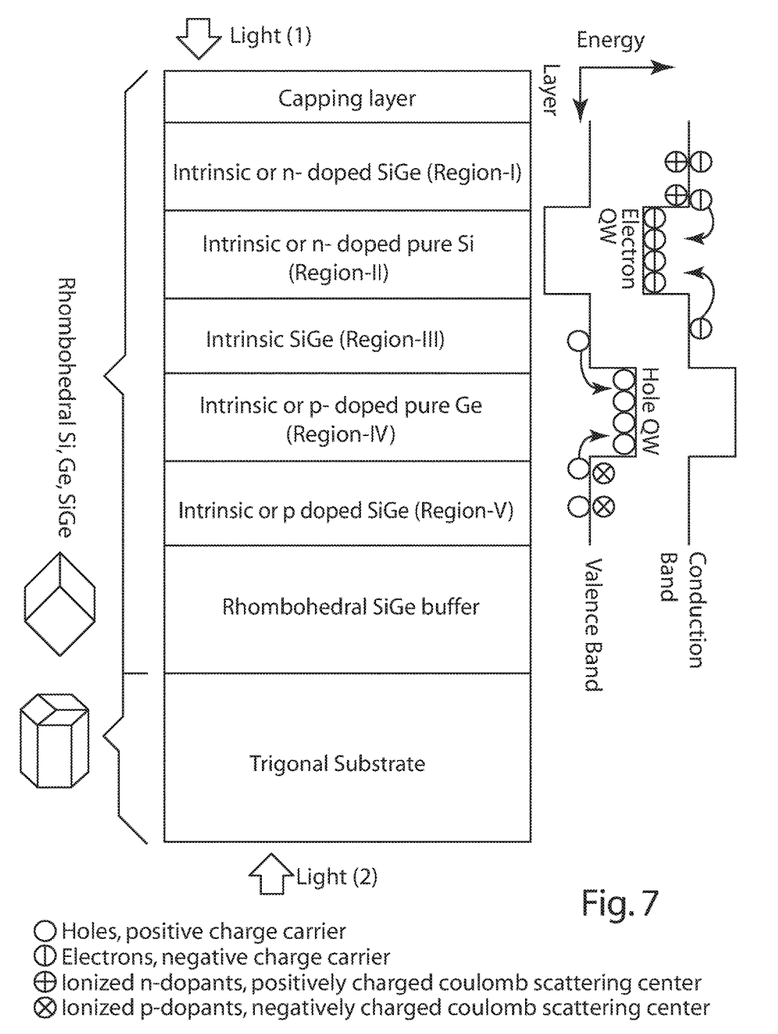
FIG. 7 is a schematic diagram that shows an enhanced solar cell structure-II with high mobility transport layers made of electron quantum well and hole quantum well.

With further reference to FIGS. 6 and 7, enhanced solar cell structures can be fabricated by integrating electron quantum well of pure Si layer and hole quantum well of pure Ge layer together.

Region-I is intrinsic or moderately n-type doped SiGe which generates free electrons upon light injection and Region-II is intrinsic or low n-type doped pure Si layer as an electron quantum well (QW) for high mobility transport layer. Region-III is an optional intrinsic SiGe layer that separates two high mobility electron-transport layers, electron quantum well and hole quantum well. Region-III also generates and provides electrons and holes into Region-II (electron QW) and Region-IV (hole QW) upon light injection. Region IV is made with intrinsic or low p-type doped pure Ge (no Si) layer as hole QW for high mobility hole-transport layer. Region-V is intrinsic or moderately p-type doped SiGe layer that generates and provides mobile holes into Region-IV (hole QW). An optional capping layer reduces charge carrier loss into the semiconductor surface and an optional rhombohedral SiGe buffer layer improves single crystalline quality of Region-I to Region-V. The light injection can be from above the surface "Light(1)" or form backside through transparent trigonal substrate "Light(2)." Many trigonal substrates such as Sapphire are transparent in the solar spectrum. Therefore, backside illumination can be made through transparent trigonal substrate. This arrangement has advantages, including (1) metal electrodes can be deposited on the front side without forming shadows; and (2) additional patterning and etching can be formed on the backside of a transparent trigonal substrate to absorb more direct sun light or ambient environmental light. FIG. 7 shows another similar structure as that of FIG. 6.

The enhanced solar cell structures in FIGS. 6 and 7 can be applied to not only rhombohedral Si/Ge/SiGe structures on trigonal substrates, but also conventional cubic Si/Ge/SiGe structures on square (100) planes of cubic substrates. The high mobility electron and hole transport layers are separately connected to (−) and (+) metal electrodes by ohmic contact and deliver more photo-voltaic current than conventional solar cells.

Figure 8:
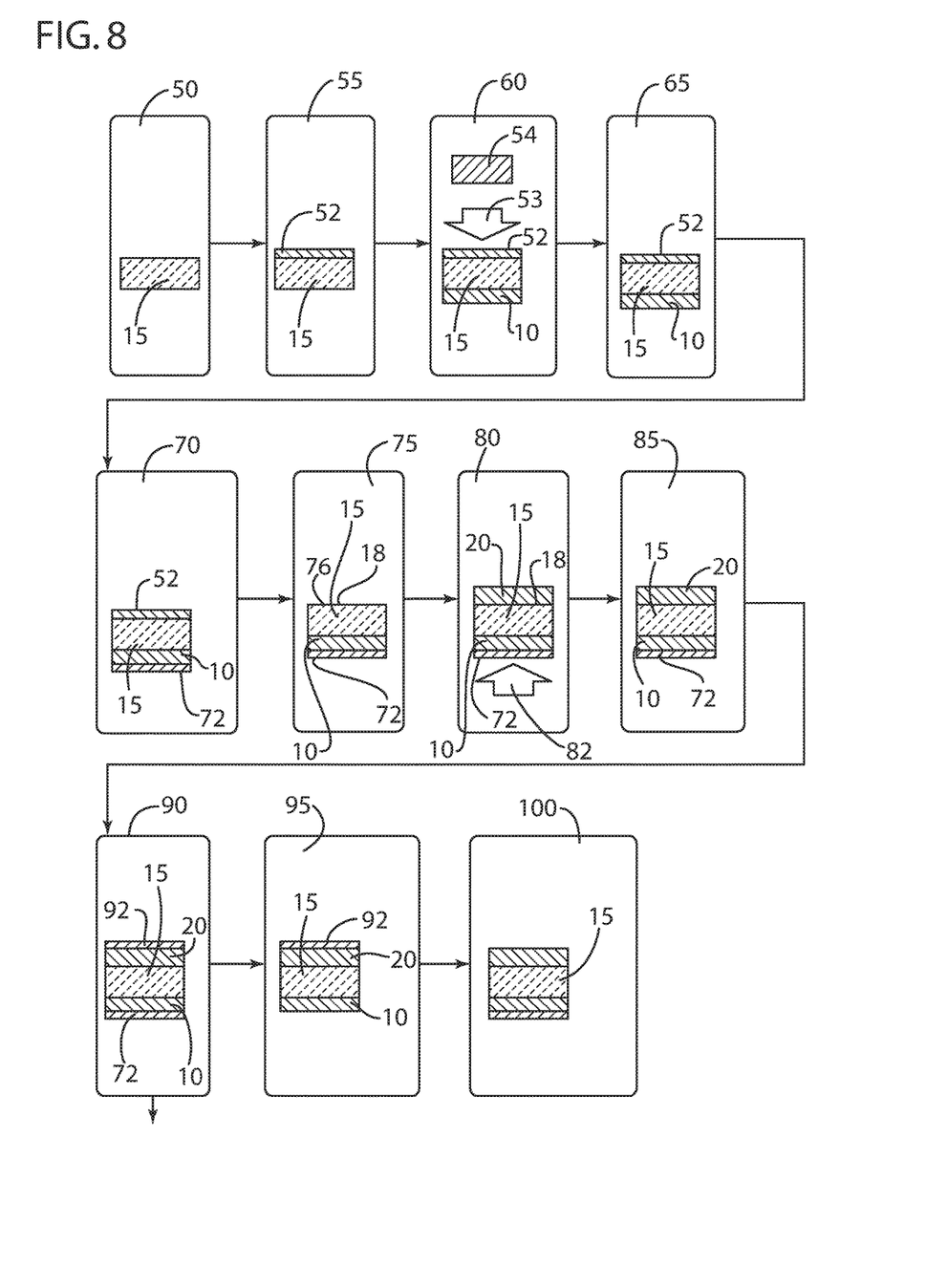
FIG. 8 is a flowchart showing fabrication of a device according to one embodiment of the present invention.

With reference to FIG. 8, a process of fabricating a multi layer hybrid structure 30 includes providing a C-plane Sapphire wafer 15 at step 50. Processes for fabricating C-plane Sapphire wafers are known, such that step 50 will not be described in detail. An optional heat absorption layer 52 such as Carbon (C) or Titanium (Ti) can be deposited on one side of the Sapphire wafer 15 at step 55 utilizing a suitable known process. A substrate heater 54 is utilized to apply IR heat 53 to raise the temperature of the Sapphire layer 15 to the optimum growth temperature for rhombohedrally aligned Si/SiGe on C-plane Sapphire. The optional heat absorbing layer 52 absorbs more IR heat 53 and assists in maintaining a uniform high substrate temperature. It will be understood that other heating methods and processes can also be utilized.

At step 60, Si/SiGe layers 10 are grown on the back side of the Sapphire wafer 15 utilizing a known epitaxial growth method. Examples of such processes include sputtering, MBD, MOCVD, PVE, HYPE, e-Beam deposit, LPE, LPCD, etc. Optional Si/SiGe device pre-fabrication processes such as chemical-mechanical polishing (CMP), dopant drive-in, ion-implantation, and other such processes can optionally be performed at step 65. Deposition or growth of a protection layer 72 is performed at step 70. Layer 72 protects the Si/SiGe layer 10 during formation of the III-Nitride structures.

In step 75, the optional heat absorbing layer 52 is removed (if necessary) utilizing a suitable known etching process such as wet etching, dry etching, plasma etching, reactive ion etching, or the like to form an exposed Sapphire surface 76. Then, at step 80, heat 82 is applied and III-Nitride layers 20 such as GaN, AlN, AlGaN, InGaN, and InN are grown on the exposed surface 76 of front side 18 of C-plane Sapphire (opposite side from Si/SiGe layers). III-Nitride processes are known in the art, and this step in the process will not therefore be described in detail. Known III-Nitride pre-device fabrication processes such as chemical-mechanical polishing (CMP), dopant drive-in, ion-implantation, and etc. can be performed in step 85. In step 90, a second protection layer 92 (such as silicon oxide or silicon nitride) is deposited or grown utilizing known processes. Second protection layer 92 protects the III-Nitride layers 20. After step 90, the hybrid wafer 30 with Si/SiGe layers 10 and III-Nitride layers 20 can be used as a wafer product.

It will be understood that steps 65 and 85 are optional, and can or can not be included in a hybrid wafer product according to the present invention.

After step 90, the hybrid wafer product can be further processed by removing and depositing each protection layer at a time and performing further post-wafer device fabrications as steps 95 and 100 in order make full hybrid circuit with Si/SiGe 10 on one side and III-Nitride 20 on the other side. A double sided hybrid wafer product 30 can be commercialized after stop 90 and full hybrid devices/products can be commercialized after step 100. It will be understood that it is possible to exchange the order of growth and device fabrication sequences of Si/SiGe and III-Nitrides such that III-Nitrides are grown first and Si/SiGe layers are grown later. The double sided hybrid crystal growth technology described above also applies to Si(Ge)/Sapphire/ZnO hybrid structure as well since ZnO has the same Wurtzite crystal structure as III-Nitride on C-plane Sapphire.

Growth of the Si/SiGe and III-Nitrides during the process illustrated in FIG. 8 can be adjusted utilizing x-ray diffraction methods as described in U.S. Pat. Nos. 7,769,135 and 7,558,371. Use of these x-ray diffraction methods provides quality control and permits the optimum growth parameters for forming hybrid crystals with more than 99% single crystallinity. These x-ray diffraction methods permit measuring the single crystal versus twin defect ratio in full wafer scale.

It will be understood that the principles and processes described above can also be utilized with SiGeC alloy in addition to SiGe alloy on C-plane sapphire. Si, Ge, and C are group IV semiconductor materials that can readily build the rhombohedral double side structure with GaN in a substantially similar epitaxy.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "some embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

This written description uses examples to disclose the invention, including the best mode, and also to enable any person skilled in the art to make and use the invention. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method of fabricating an electronic device, the method comprising:
providing a trigonal crystal substrate defining a (0001) C-plane;
applying heat to the trigonal crystal substrate to raise a temperature of the trigonal crystal substrate to a level that facilitates growth of rhombohedrally aligned material;
growing on the substrate a rhomohedrally aligned buffer layer comprising a material selected from a group consisting of group IV semiconductors and alloys of group IV semiconductors, wherein the rhombohedrally aligned buffer layer comprises a plurality of rhombohedrally aligned (111)-oriented crystals disposed on the (0001) C-plane of the trigonal crystal substrate;
growing a first region of material on the rhombohedrally aligned buffer layer, the first region comprising a p+doped SiGe layer having a thickness of less than about 100 nm; and
growing a secondary region on the first region, the secondary region comprising a p–doped Ge or intrinsic Ge material to form a quantum well structure for fast transport of holes such that the secondary region collects holes from the first region.

2. The method of claim 1, further comprising:
growing an additional layer of the first region of material on the secondary region; and
growing an additional layer of the secondary region on the additional layer of the first region of material.

3. The method of claim 1, wherein the first region with the p+doped SiGe layer has a high density of p-type dopants and numerous holes generated from the p-type dopants.

4. The method of claim 1, wherein the secondary region is low-density p–doped Ge doped at a $10^{16}/cm^3$ concentration.

5. The method of claim 1, wherein the first region further comprises a first layer of n+doped SiGe material, the method further comprising:
growing a layer of Si material on the first layer of n+doped SiGe material;
growing a second layer of n+doped SiGe on the layer of Si material such that the Si material is disposed between the first and second layers of n+doped SiGe.

6. The method of claim 1, wherein the secondary region comprises a valence band top energy level sufficient to form a quantum well for holes.

7. The method of claim 1, wherein the first region has a hole mobility that is less than a hole mobility of the secondary region.

8. The method of claim 1, wherein a hole mobility of the secondary region is at least two times higher than a hole mobility of the first region.

9. The method of claim 1, wherein the trigonal crystal substrate comprises a Sapphire material.

10. The method of claim 1, wherein the rhombohedrally aligned (111)-oriented crystals comprise a group IV semiconductor material.

11. A method of fabricating an electronic device, the method comprising:

provoding a trigonal crystal substrate defining a (0001) C-plane;

applying heat to the trigonal crystal substrate to raise a temperature of the trigonal crystal substrate to a level that facilitates growth of a rhombohedrally aligned material selected from a group consisting of Si and SiGe;

growing a layer of buffer material on the trigonal crystal substrate, the layer of buffer material selected from a group consisting of group IV semiconductors and alloys of group IV semiconductors, the layer of buffer material including a plurality of rhombohedrally aligned (111)-oriented crystals disposed on the (0001) C-plane of the trigonal crystal substrate;

growing a first region of material on the layer of buffer material, the first region comprising an intrinsic or doped first semiconductor material selected from a group consisting of Si, Ge, and SiGe, the first region comprising a first layer of SiGe material with p+doped SiGe;

growing a layer of Ge material including p−doped Ge or intrinsic Ge on the first layer of SiGe material with p+doped SiGe; and growing a second layer of SiGe material with p+doped SiGe on the layer of Ge material such that the layer of Ge material is disposed between the first and second layers of SiGe material with p+doped SiGe.

12. The method of claim 11, wherein the first region further comprises a first layer of n+doped SiGe material.

13. The method of claim 12, further comprising:

growing a layer of Si material on the first layer n+doped SiGe material;

growing a second layer of n+doped SiGe on the layer of Si material such that the Si material is disposed between adjacent layers of n+doped SiGe.

14. The method of claim 13, wherein the layer of Si material comprises n−doped Si, or intrinsic Si.

15. The method of claim 11, wherein the layer of buffer material comprises SiGe.

* * * * *